United States Patent
Ito et al.

(10) Patent No.: US 7,183,766 B2
(45) Date of Patent: Feb. 27, 2007

(54) SUPERCONDUCTING MAGNETIC FIELD GENERATION APPARATUS AND SPUTTER COATING APPARATUS

(75) Inventors: Yoshitaka Ito, Chiryu (JP); Masaaki Yoshikawa, Kariya (JP); Yousuke Yanagi, Chiryu (JP); Hiroyasu Nomachi, Okazaki (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 108 days.

(21) Appl. No.: 10/913,369

(22) Filed: Aug. 9, 2004

(65) Prior Publication Data
US 2005/0030017 A1    Feb. 10, 2005

(30) Foreign Application Priority Data
Aug. 7, 2003   (JP) .............................. 2003-289334

(51) Int. Cl.
*G01R 33/035* (2006.01)
(52) U.S. Cl. ...................................... 324/248; 505/845
(58) Field of Classification Search ................ 324/248; 505/845–846; 600/409; 336/DIG. 1
See application file for complete search history.

(56) References Cited

U.S. PATENT DOCUMENTS 5,517,169 A * 5/1996 Laskaris et al. ............ 335/301
5,966,944 A * 10/1999 Inoue et al. .................. 62/51.1

FOREIGN PATENT DOCUMENTS

| JP | 10-072667 | 3/1998 |
| JP | 2002-146529 | 5/2002 |
| JP | 2004-91872 | 3/2004 |

* cited by examiner

*Primary Examiner*—Bot LeDynh
(74) *Attorney, Agent, or Firm*—Oblon, Spivak, McClelland, Maier & Neustadt, P.C.

(57) ABSTRACT

A superconducting magnetic field generating apparatus includes a superconducting body for generating a magnetic field below a critical temperature of the superconducting body, a thermal insulation vessel having a space for accommodating the superconducting body, and a ferromagnetic body for adjusting a magnetic field distribution generated from the superconducting body wherein at least a part of the ferromagnetic body is disposed around the superconducting body and a magnetic circuit is formed so as to form the magnetic field distribution in a common side of the superconducting body and the part of the ferromagnetic body.

21 Claims, 13 Drawing Sheets

SUPERCONDUCTING MAGNETIC FIELD GENERATION APPARATUS AND SPUTTER COATING APPARATUS

CROSS REFERENCE TO RELATED APPLICATIONS

This application is based on and claims priority under 35 U.S.C. § 119 to Japanese Patent Application 2003-289334, filed on Aug. 7, 2003, the entire content of which is incorporated herein by reference.

FIELD OF THE INVENTION

This invention generally relates to a superconducting magnetic field generating apparatus and a sputter coating apparatus using the superconducting magnetic field generating apparatus.

BACKGROUND

A bulk type superconducting material made by melt processing method will be explained as an example of known art. The bulk type superconducting material made by melt processing method including yttrium-based material (for example, Y—Ba—Cu—O superconducting bulk magnet) can generate a strong magnetic field which is extremely higher than conventional permanent magnet. Therefore, this superconducting bulk magnet has been studied for applying it to a sputter gun of a magnetron sputtering coating apparatus. For example, JPH10-72667A discloses a magnetron sputter coating apparatus with a superconducting bulk magnet as a sputter gun. In addition, JP2002-146529A discloses a magnetron sputter coating apparatus with plural superconducting bulk magnet as a sputter gun.

Furthermore, as a part of development of the superconducting magnetic field generating apparatus, the applicant of the present invention has been developed (hereinafter referred to as development example) wherein a yoke forming a magnetic circuit is fixed to a vacuum chamber side, as shown in FIGS. 11–13. According to this configuration, since the yoke is fixed to the vacuum chamber side, a magnetic field distribution generated from the superconducting body can be corrected using the yoke.

FIG. 11 shows an illustration of the superconducting magnetic field generating apparatus 1X according to the development example. FIG. 12 shows an illustration of a condition before attaching the superconducting magnetic field generating apparatus 1X to the sputter coating apparatus 200X according to the development example. FIG. 13 is an illustration of a condition after attaching the superconducting magnetic field generating apparatus 1X to the sputter coating apparatus 200X according to the development example.

Hereinafter configuration of the development example will be explained with reference to FIG. 11. A superconducting body 2X and a lower yoke 63X are accommodated in a thermal insulation vessel 3X which is kept to high vacuum condition. The superconducting body 2X, the lower yoke 63X and the thermal insulation vessel 3X are fixed to a cold head 41X of a cooling member 43X.

Excitation method of the superconducting body 2X will be explained below. The thermal isolating vessel 3X accommodating the superconducting body 2X is inserted to an opening of a superconducting magnet 100X. With applying a designated magnetic field to the superconducting magnet 100X, the superconducting body 2X is cooled to below critical temperature of superconduction. In this condition, the superconducting body 2X acquires the magnetic field. After the designated magnetic field is turned off, the thermal insulation vessel 3X accommodating the superconducting body 2X is removed from the opening of the superconducting magnet 100X.

For the superconducting magnetic body 2X, although the lower yoke 63 is provided under the superconducting body 2X, a ring yoke 61X is not provided along the outer circumference of the superconducting body 2X. Therefore, line of magnetic force 67m is spread above the superconducting body 2X (upward direction in FIG. 11) with wide area.

As shown in FIG. 12 and FIG. 13, a ring yoke 61X made of ferromagnetic body is fixed to a vacuum chamber 204X side of the sputter coating apparatus 200X. For attaching the superconducting magnetic field generating apparatus 1X to the sputter coating apparatus 200X, the superconducting magnetic field generating apparatus 1X and a cooling member 43X are placed under attaching portion of the sputter coating apparatus 200X as shown in FIG. 12. Next, the superconducting magnetic field generating apparatus 1X is jacked up using a lifting member 48X (jack), and inserted to opening of the ring yoke 61X as shown in FIG. 13. Then, the ring yoke 61X is placed along the outer circumference of the superconducting body 2X.

When the superconducting magnetic field generating apparatus 1X is attached to the sputter coating apparatus 200X, misalignment caused by attractive force between the superconducting body 2X and the ring yoke 61X since the ring yoke 61X is fixed to the vacuum chamber 204X. Therefore, a damper 210X and a guide 211X are provided as an attaching means to prevent misalignment.

Also, to prevent crashing of inner wall of the superconducting body 2X and the ring yoke 61X, a strong construction is needed for attaching means (the damper 210X and the guide 211X), and the apparatus becomes large and complicated structure.

In addition, as shown in FIG. 11, the thermal insulation vessel accommodating the superconducting body 2X is exposed until the super conducting magnetic field generating apparatus 1X is attached to the sputter coating apparatus 200X.

In addition, when a target 206X of the sputter coating apparatus 200X is replaced, to release the target 206X from magnetic force, the super conducting magnetic field generating apparatus 1X is moved to downward. In this operation, magnetic field distribution by the superconducting body 2X is changed with separating the superconducting body 2X from the ring yoke 61X. Therefore, changing frequency of both magnetic force and magnetic field distribution of the superconducting body 2X is increased with increasing frequency of replace, and magnetic force and magnetic field distribution is attenuated.

SUMMARY OF THE INVENTION

According to an aspect of the present invention, a superconducting magnetic field generating apparatus includes a superconducting body for generating a magnetic field below a critical temperature of the superconducting body, a thermal insulation vessel having a space for accommodating the superconducting body, and a ferromagnetic body for adjusting a magnetic field distribution generated from the superconducting body wherein at least a part of the ferromagnetic body is disposed around the superconducting body and a magnetic circuit is formed so as to form the magnetic field distribution in a common side of the superconducting body and the part of the ferromagnetic body.

It is preferable that the ferromagnetic body is detachably attached to an outer side of the thermal insulation vessel.

It is preferable that a supporting member for supporting the ferromagnetic body is detachably provided to the thermal insulation vessel and detachably setting the ferromagnetic body to a circumferential predetermined position of the thermal insulation vessel.

It is preferable that the supporting member is moved in axial direction of the thermal insulation vessel along an outer wall of the thermal insulation vessel as a guide.

It is preferable that the ferromagnetic body is provided with the thermal insulation vessel as a unit.

It is preferable that the ferromagnetic body is accommodated in the thermal insulation vessel.

It is preferable that the ferromagnetic body is cooled using a cooling means.

It is preferable that the superconducting body is prepared by melt processing method.

It is preferable that a major element of the superconducting body is RE-Ba—Cu—O (RE is at least one of Y, La, Nd, Sm, Eu, Gd, Er, Yb, Dy and Ho).

It is preferable that the superconducting body includes at least one of Ag, Au, Pt, Rh and Ce.

It is preferable that the superconducting magnetic field generating apparatus is detachably attached to any apparatus which uses strong magnetic field.

It is an another aspect of the present invention that a sputter coating apparatus for coating a material by applying a raw material supplied from a target to a surface of the material to be coated includes a target holder for supporting the target including the raw material, an object holder for supporting the material to be coated, a vacuum chamber including the target holder and the object holder, and a sputter gun provided adjacent to the target holder for generating a magnetic field wherein the sputter gun is composed of the superconducting magnetic field generating apparatus according to one aspect of the present invention and generates the magnetic field so as to concentrate on surface of the target.

It is an another aspect of the present invention that a superconducting magnetic field generating apparatus includes a superconducting body for generating a magnetic field below a critical temperature of the superconducting body, a cooling apparatus cooling the superconducting body below the critical temperature, a thermal insulation vessel having a space for accommodating the superconducting body, and a ferromagnetic body disposed at outer circumference of the superconducting body, wherein a magnetic circuit is formed as closed loop between the ferromagnetic body and the superconducting body.

BRIEF DESCRIPTION OF THE DRAWINGS

The foregoing and additional features and characteristics of the present invention will become more apparent from the following detailed description considered with reference to the accompanying drawings, wherein.

DETAILED DESCRIPTION

A preferred embodiment of the present invention will be described hereinbelow in detail with reference to the accompanying drawings.

Figure 1:
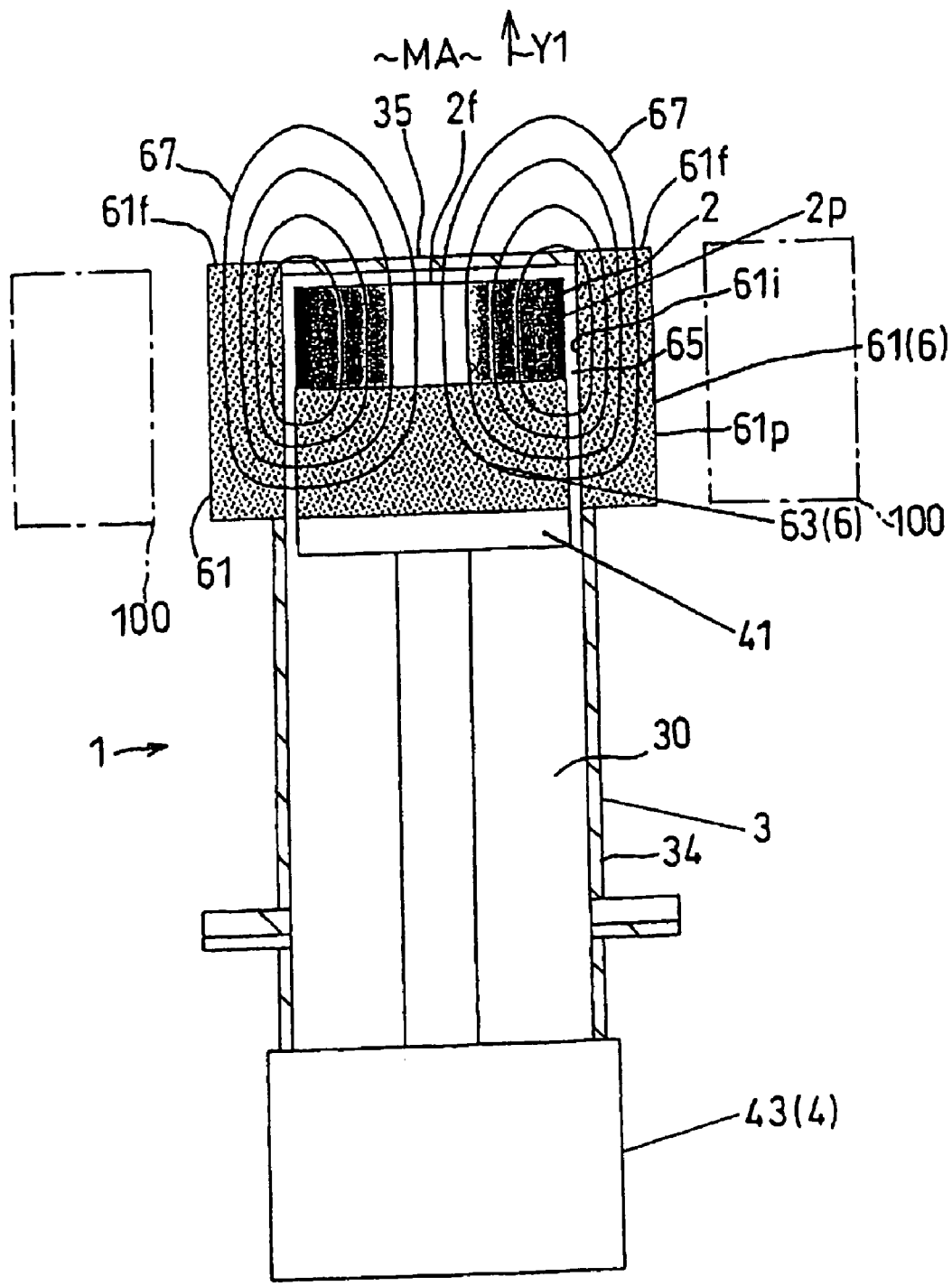
FIG. 1 is a cross sectional view illustrating a superconducting magnetic field generation apparatus according to a first embodiment of the present invention.

(First embodiment) FIG. 1 shows a superconducting magnetic field generating apparatus 1 according to a first embodiment. As shown in FIG. 1, the superconducting magnetic field generating apparatus 1 includes a superconducting body 2 which serves as bulk magnet generating a magnetic field by applying a magnetic field below a superconducting critical temperature, a thermal insulation vessel 3 with cylindrical shape including a space 30 for accommodating the superconducting body 2 in sealing condition, a cooing means 4 for cooling the superconducting body 2, and a ferromagnetic body 6 for adjusting a magnetic field distribution 67 generated from the superconducting body 2.

The cooling means 4 is accommodated in the space 30 of the thermal insulation vessel 3 to decrease temperature of the superconducting body 2 to below the superconducting critical temperature. The cooling means 4 includes a cold bead portion 41 which is cooled and a cooling portion 43 which cools the cold head portion 41. The cooling portion may be composed of a GM cooler (Gifford-McMahon Cycle Cryocoolers), a pulse tube cooler, a Stirling cycle cooler, and so on.

The thermal insulation vessel 3 is made of a metal, and the thermal insulation vessel 3 has outer wall 34 with cylindrical shape for separating the space 30 from outside and an upper end wall 35 provided at upper end portion of the thermal insulation vessel 3. The interior of the space 30 is depressurized to below the atmosphere pressure to make vacuum insulating using a vacuum pumping system (not shown in FIG. 1).

The superconducting body 2 is disposed at one end of the space (in other wards, upper portion of the thermal insulation vessel 3) so as to face the upper end wall 35 of the thermal insulation vessel 3. The superconducting body 2 is formed by a melt processing method which includes a melting process and a solidification process, and the super conducting body is shaped as thick disc. Main component of the superconducting body 2 is expressed as RE-Ba—Cu—O wherein RE corresponds to at least one of Y, La, Nd, Sm, Eu, Gd, Er, Yb, Dy, and Ho. The superconducting body 2 may include at least one of Ag, Au, Pt, Rh, and Ce.

The ferromagnetic body 6 includes a ring yoke 61 disposed around the superconducting body 2 with a same axis and a lower yoke 63 (which serves as a second yoke) disposed under the superconducting body 2 with a same axis. According to this arrangement, an inner wall 61$i$ of the ring yoke 61 surrounds the outer wall 2$p$ of the superconducting body 2 with putting an interstice 65 formed as ring shape between the inner wall 61$i$ and the outer wall 2$p$. Low temperature may be easily maintained since the interstice 65 thermally intercepts between the superconducting body 2 (low temperature side) and the ring yoke 61 (high temperature side) which is exposed to room temperature atmosphere at an outer wall 61$p$.

As shown in FIG. 1, the ring yoke 61 is integrated with the upper portion of the thermal insulation vessel 3 so as to place the ring yoke 61 along outer periphery of the superconducting body 2. Therefore, the inner wall 61$i$ of the ring yoke 61 is formed to be an extension of the outer wall 34 of the thermal insulation vessel 3. In addition, an upper end surface 61$f$ of the ring yoke 61 is disposed in plane with the upper wall 35 of the thermal insulation vessel 3 to contact or to approach with a corresponding member. The lower yoke 63 is placed under the superconducting body 2 with the same axis and contacted with lower face of the superconducting body 2. The lower yoke 63 is accommodated in the space 30 of the thermal insulation vessel 3 with the superconducting body 2.

As a material forming the ferromagnetic body 6 (both the ring yoke 61 and the lower yoke 63), saturation flux density or remanent flux density is desired to be high. For example, a permendur (Fe—Co—V system), a soft magnetic iron (Fe), a silicon steel (Fe—Si system), a sendust (Fe—Si—Al system), and so on may be used as the ferromagnetic body 6. These materials having high magnetic permeability can functions as a yoke passing a magnetic force.

According to this configuration, a magnetic circuit 67 is formed with a closed loop shape in a space MA as follows. Namely, a magnetic force is radiated from a one end (upper side) 2$f$ of the superconducting body 2 to a space MA (an arrow Y1 direction in FIG. 1), spread into radial direction of the superconducting body 2, corrected at the upper end surface 61$f$ of the ring yoke 61, passed through the ring yoke 61 and the lower yoke 63, and returned to the other end (lower side) of the superconducting body 2. The magnetic circuit 67 corresponds to a magnetic field distribution generated from the super conducting body 2. In this condition, the ring yoke 61 and the lower yoke 63 adjust the magnetic field distribution.

According to the configuration of the first embodiment, other member such as a coil for applying magnetic field is not disposed between the inner wall 61$i$ of the ring yoke 61 and the outer wall of 2$p$ the superconducting body 2 as shown in FIG. 1. Therefore, the inner wall 61$i$ of the ring yoke 61 may be arbitrarily closed to or separated from the outer wall 2$p$ of the superconducting body 2 in the radial direction of each. In other words, there is a lot of flexibilities for arrangement of the ring yoke 61 relative to that the coil for applying magnetic field is provided between the ring yoke 61 and the superconducting body 2. The coil increases radial direction size since wire is wound for many times.

According to the first embodiment, a magnetic field is applied to the superconducting body 2 with a condition that the ring yoke 61 is supported by the thermal insulation vessel 3 and an upper portion of the thermal insulation vessel 3 is inserted to an opening of a superconducting magnet 100 formed as ring shape (shown in FIG. 1). While the magnetic field is applied to the superconducting body 2 using the superconducting magnet 100, the superconducting body 2 and the ring yoke 61 is magnetized along the magnetic field direction applied by the superconducting magnet 100. When the applying magnetic field is turned to zero, an magnetic field generated by the superconducting body 2 is applied to the ring yoke, and the ring yoke 61 is magnetized in opposite direction relative to the magnetic field direction applied by the superconducting magnet 100. Therefore, magnetic pole of the upper end surface 61$f$ of the ring yoke 61 becomes opposite to the upper side 2$f$ of the superconducting body 2.

According to the first embodiment, the ring yoke 61 is integrated with the thermal insulation vessel 3. Therefore, when the superconducting body 2 is set up to use as a magnetic pole, setting of the ring yoke 61 to the thermal insulation vessel 3 is not needed after the superconducting body 2 is magnetized. Also, configuration of the magnetic pole may be compact.

As shown in FIG. 1, since the ring yoke 61 is disposed along outer circumference of the superconducting body 2, magnetic field generated from the superconducting body 2 is easily adjusted into outer radius direction so as to move to the ring yoke 61. In this manner, the magnetic circuit 67 is formed as closed loop which passes the ring yoke 61, the lower yoke 63, and the superconducting body 2. Therefore, radiation direction of the magnetic field generated from the superconducting body 2 is restricted to the upper direction of the superconducting body 2.

In addition, according to the first embodiment, the ring yoke 61 is not attached to an apparatus utilizing strong magnetic field such as a sputter coating apparatus but attached to the superconducting magnetic field generating apparatus 1. It may decrease effect of excessive magnetic force between the superconducting magnetic field generating apparatus 1 and the apparatus utilizing strong magnetic field such as the sputter coating apparatus when the superconducting magnetic field generating apparatus 1 is attached to the apparatus utilizing strong magnetic field such as the sputter coating apparatus. It makes a special attaching mechanism unnecessary. In addition, the superconducting magnetic force generating apparatus 1 may be easily attached to the apparatus utilizing strong magnetic field such as the sputter coating apparatus wherein the superconducting magnetic force generating apparatus 1 is made as a unit body.

Figure 2:
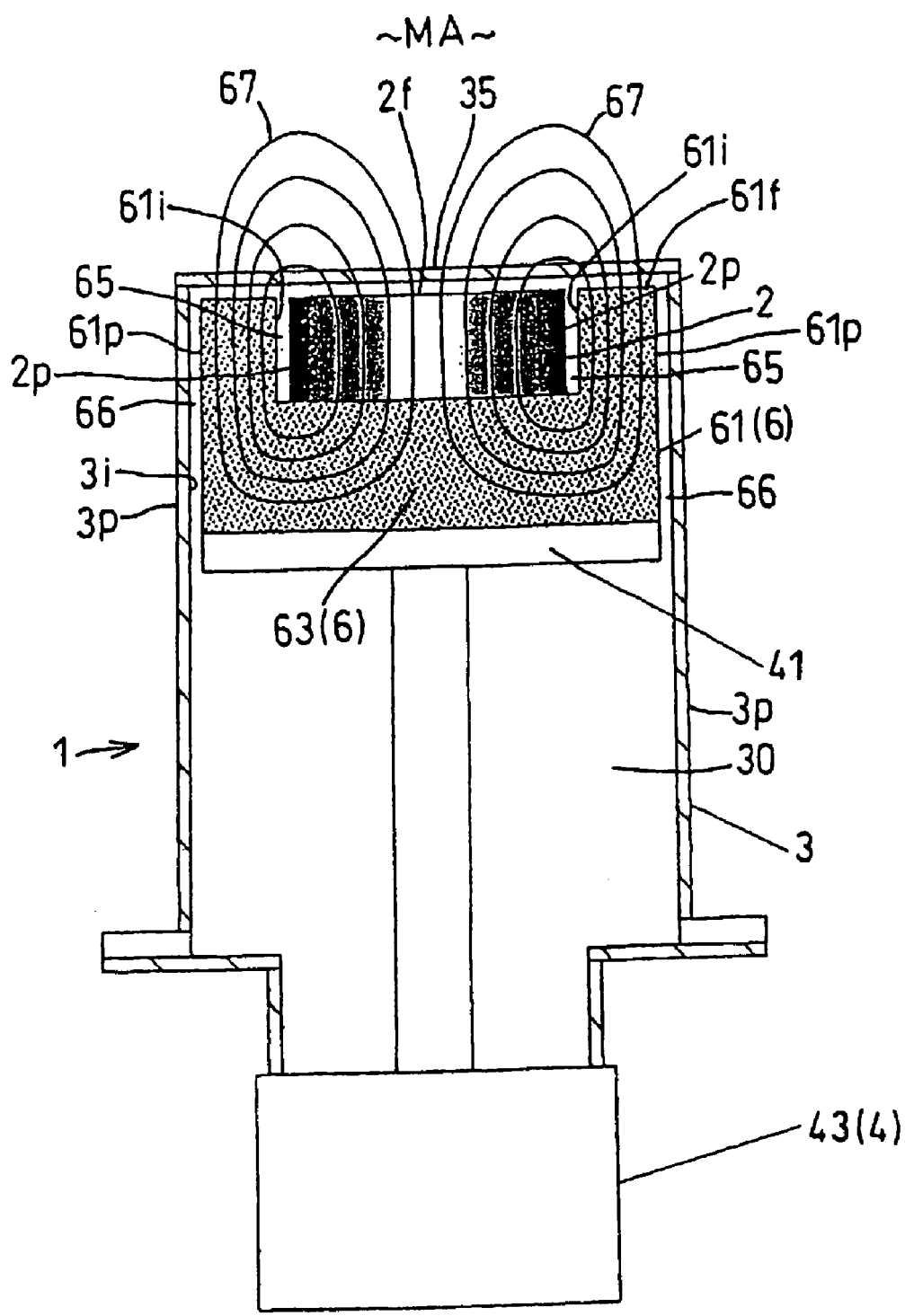
FIG. 2 is a cross sectional view illustrating a superconducting magnetic field generation apparatus according to a second embodiment of the present invention.

(Second embodiment) FIG. 2 shows a superconducting magnetic field generating apparatus 1 according to a second embodiment. In the second embodiment, same numbers as the first embodiment are applied for portions which operate similarly to the first embodiment thereof. Different points from the first embodiment will be explained as follows.

According to the second embodiment, a ring yoke 61 and a superconducting body 2 are disposed in a space 30 of a thermal insulation vessel 3 wherein the ring yoke 61 is disposed along outer wall 2p of the superconducting body 2. As shown in FIG. 2, the ring yoke 61 and the lower yoke 63 are integrally formed to make a ferromagnetic body 6.

As shown in FIG. 2, an inner wall 61i of the ring yoke 61 surrounds the outer wall 2p of the superconducting body 2 with putting an interstice 65 formed as ring shape between the inner wall 61i and the outer wall 2p. An outer wall 61p of the ring yoke 61 is surrounded by an inner wall 3i of the thermal insulation vessel 3 with putting an interstice 66 formed as ring shape between the outer wall 2p and the inner wall 3i. Since the ring yoke 61, the lower yoke 63, and the superconducting body 2 are accommodated in upper portion of the space 30 of the thermal insulation vessel 3, the ring yoke 61, the lower yoke 63, and the superconducting body 2 are cooled below room temperature (commonly below critical temperature of the superconducting body 2) using a cold head 41.

As shown in FIG. 2, the interstice 66 is formed between the thermal insulation vessel 3 and the ring yoke 61. Also, the interstice 65 is formed between the ring yoke 61 and the super conducting body 2. Although an outer wall 3p of the thermal insulation vessel 3 is exposed to ambient air having room temperature, these interstices 65, 66 makes the ring yoke 61 and the superconducting body 2 easy to keep low temperature.

According to the second embodiment, a member such as a coil for applying magnetic field is not disposed at the interstice 65 formed between the ring yoke 61 and the superconducting body 2. Therefore, the inner wall 61i of the ring yoke 61 may be arbitrarily closed to or separated from the outer wall 2p of the superconducting body 2 in the radial direction of each. In other words, there is a lot of flexibilities for arrangement of the ring yoke 61 relative to that the coil for applying magnetic field is provided between the ring yoke 61 and the superconducting body 2.

Magnetic field applying method to the superconducting body 2 according to the second embodiment is essentially same as the first embodiment thereof. Namely, a magnetic field is applied to the superconducting body 2 with a condition that the ring yoke 61 is supported by the thermal insulation vessel 3 and an upper portion of the thermal insulation vessel 3 is inserted to an opening of a superconducting magnet 100 formed as ring shape (shown in FIG. 1). While the magnetic field is applied to the superconducting body 2 using the superconducting magnet 100, the superconducting body 2 and the ring yoke 61 is magnetized along the magnetic field direction applied by the superconducting magnet 100. When the applying magnetic field is turned to zero, an magnetic field generated by the superconducting body 2 is applied to the ring yoke, and the ring yoke 61 is magnetized in opposite direction relative to the magnetic field direction applied by the superconducting magnet 100. Therefore, magnetic pole of the upper end surface 61f of the ring yoke 61 becomes opposite to the upper side 2f of the superconducting body 2. In this manner a magnetic circuit 67 is formed as closed loop which passes the ring yoke 61 the lower yoke 63, and the superconducting body 2 as shown in FIG. 2.

According to the second embodiment, since the ring yoke 61 and the superconducting body 2 accommodated in the space 30 of the thermal insulation vessel 3 as shown in FIG. 2, the ring yoke 61 may be disposed with getting closer to the superconducting body 2. Therefore, magnetic pole of the superconducting magnetic field generating apparatus 1 may be formed with reduced size. Furthermore, the thermal insulation vessel 3 may be formed with simple structure.

In addition, since the ring yoke 61 is accommodated in the space 30 of the thermal insulation vessel 3, the ring yoke 61 made of ferromagnetic material is cooled and magnetic property of the ring yoke 61 may be improved. Therefore, an occupying volume of the ferromagnetic body 6 for obtaining sufficient magnetic force to form the magnetic circuit 67 can be downsized. In other words, the superconducting magnetic field generating apparatus 1 may generate stronger magnetic field than conventional one with comparing in view of volume efficiency.

Figure 3:
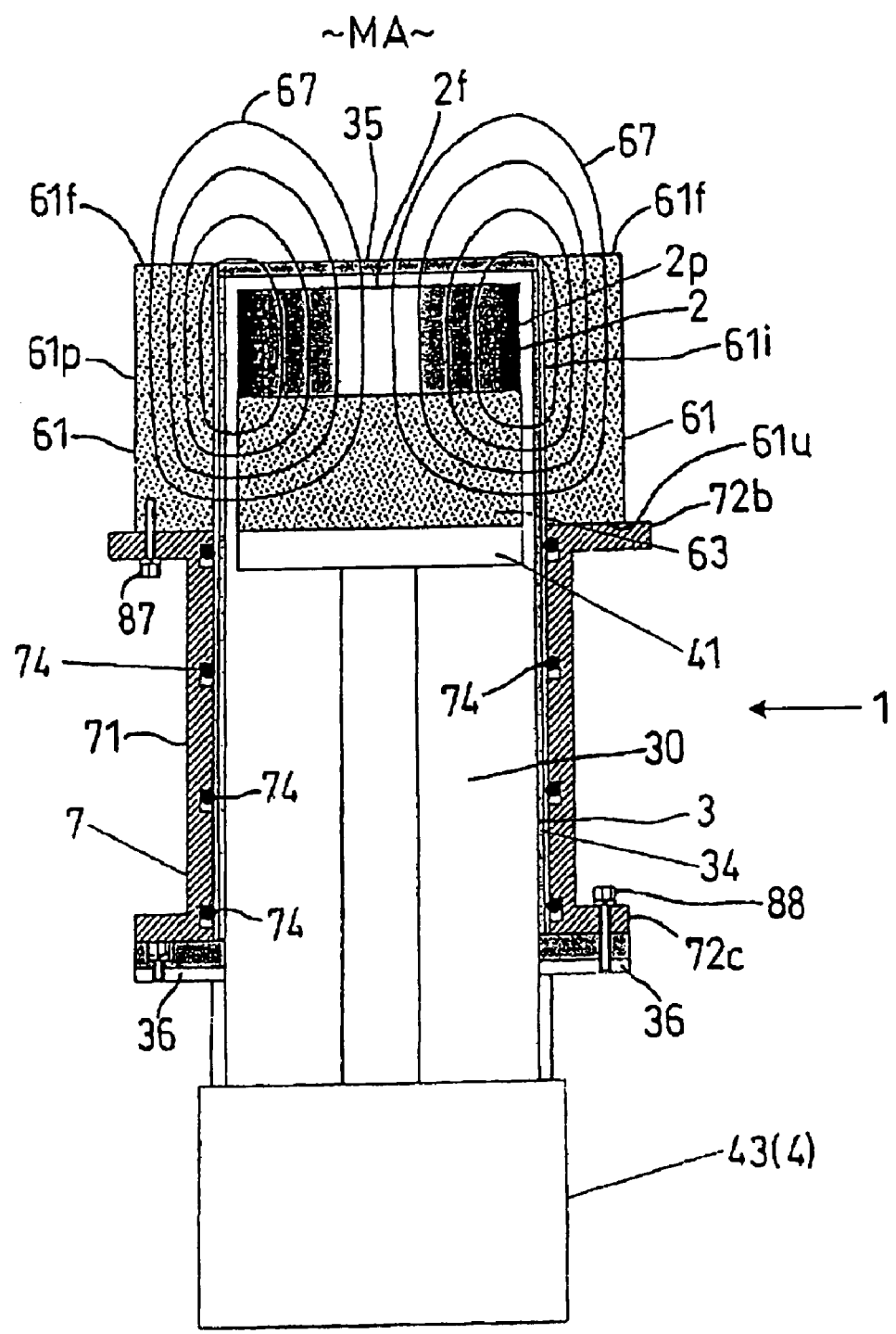
FIG. 3 is a cross sectional view illustrating a superconducting magnetic field generation apparatus according to a third embodiment of the present invention.
Figure 4:
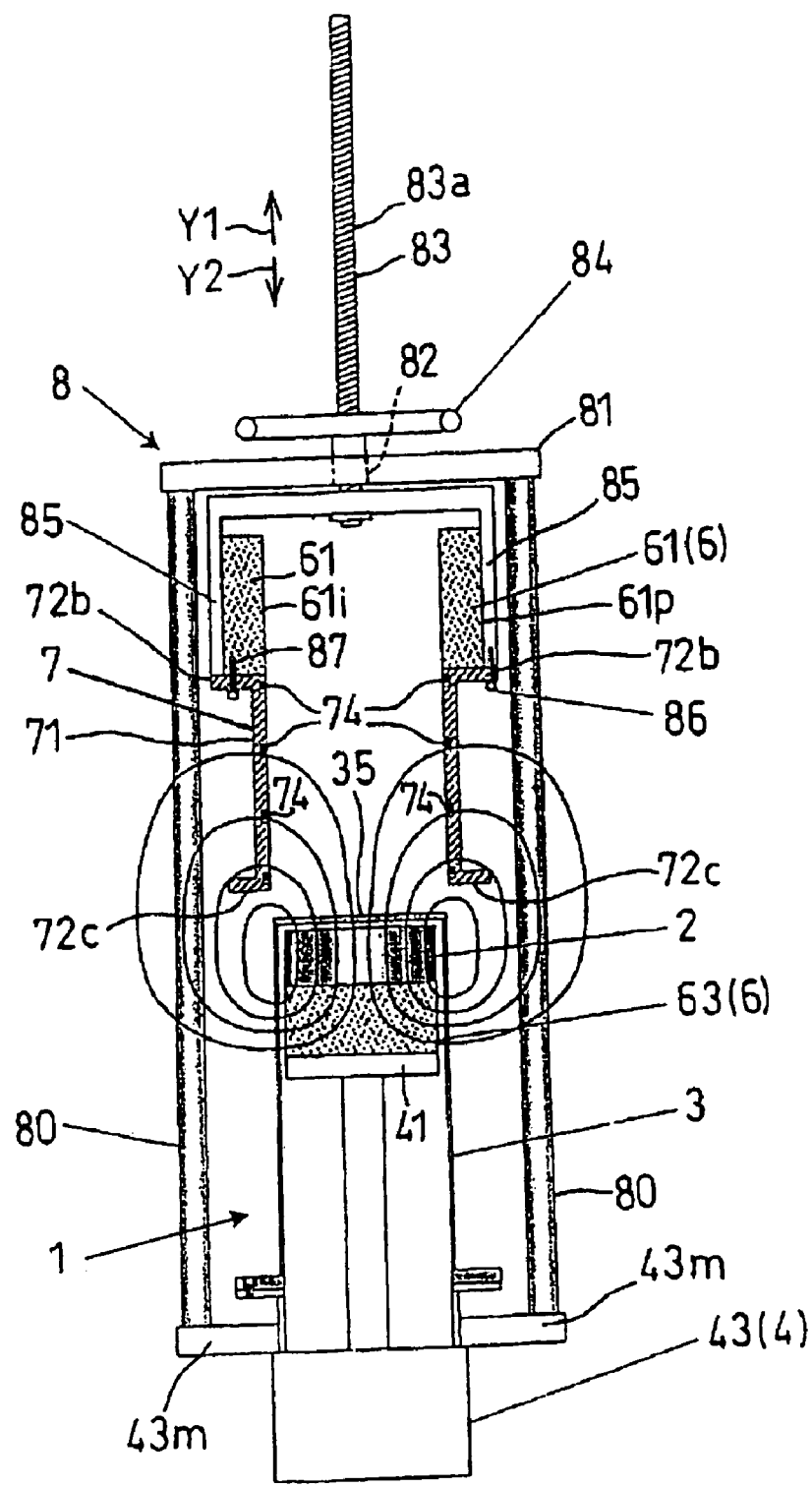
FIG. 4 is a cross sectional view illustrating a condition before attaching a ring yoke to a superconducting magnetic field generation apparatus according to a third embodiment of the present invention.
Figure 5:
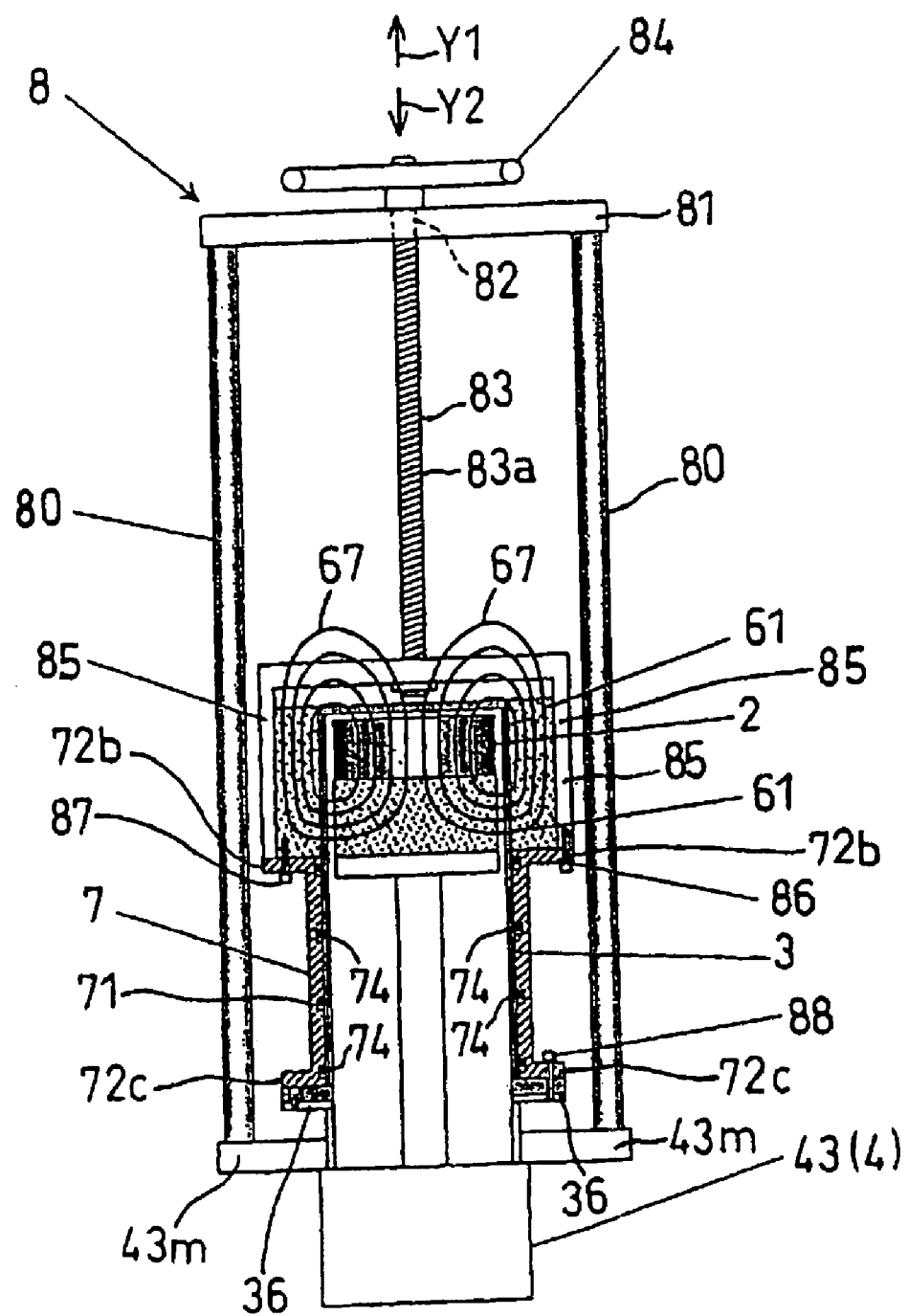
FIG. 5 is a cross sectional view illustrating a condition after attaching a ring yoke to a superconducting magnetic field generation apparatus according to a third embodiment of the present invention.

(Third embodiment) FIG. 3–FIG. 5 shows a superconducting magnetic field generating apparatus 1 according to a third embodiment. In the third embodiment, same numbers as the first embodiment are applied for portions which operate similarly to the first embodiment thereof. Different points from the first embodiment will be explained as follows.

As shown in FIG. 3, a ring yoke 61 is disposed along an outer wall 2p of a superconducting body 2 and detachably attached to the thermal insulation vessel 3. The thermal insulation vessel 3 is made of metal and formed as cylindrical shape. The thermal insulation vessel 3 includes a cylindrical outer wall 34 dividing a space 30, an end wall 35 forming a upper wall, and a projecting portion 36 projecting to outer radial direction. An supporting member 7 made of metal is disposed outer peripheral side of the thermal insulation vessel 3. The supporting member 7 includes a cylindrical portion 71 for surrounding the thermal insulation vessel 3, a projecting portion 72b projected to outer peripheral direction to contact with higher face 61u of the ring yoke 61, and a projecting portion 72c projected to outer peripheral direction to contact with the projecting portion of the ring yoke 61. The superconducting body 2 is disposed at a one end of the thermal insulation vessel 3 (namely, an upper end of the thermal insulation vessel 3) wherein an upper end face 2f of the superconducting body 2 is facing to the end wall 35 of the thermal insulation vessel 3.

According to the third embodiment, a member such as a coil for applying magnetic field is not disposed at the interstice 65 formed between the ring yoke 61 and the superconducting body 2. Therefore, the inner wall 61i of the ring yoke 61 may be arbitrarily closed to or separated from the outer wall 2p of the superconducting body 2 in the radial direction of each. In other words, there is a lot of flexibilities for arrangement of the ring yoke 61 relative to that the coil for applying magnetic field is provided between the ring yoke 61 and the superconducting body 2.

FIG. 4 and FIG. 5 show attaching procedure of the ring yoke 61 to the thermal insulation vessel 3 so as to place outer peripheral side of the superconducting body 2 after the superconducting body 2 is magnetized. FIG. 4 shows a condition before attaching the ring yoke 61 to the thermal insulation vessel 3. FIG. 5 shows a condition after attaching the ring yoke 61 to the thermal insulation vessel 3.

According to the third embodiment, a ring yoke attaching jig 8 is provided for attaching operation of the ring yoke 61 to the thermal insulation vessel 3 as shown in FIG. 4 and FIG. 5. As shown in FIG. 4, the ring yoke attaching jig 8 can be attached to a setting portion 43m of a cooling portion 43.

The ring yoke attaching jig 8 includes plural pole 80, a connecting portion 81 for connecting plural pole 80, a movable shaft member 83 including a male screw portion 83a for screwing with a female screw portion 82 formed at the connecting portion 81, a handle member 84 which drives the movable shaft portion 83 by rotational operation, and a ring yoke attaching portion 85 supported by one end (lower end) of the movable shaft portion 83.

The ring yoke 61 is detachably attached to the supporting member 7 at the projecting portion 72b so as to place it inside of the ring yoke attaching portion 85 by a second screw 87 (a second attaching member). In this condition, plural elastic member 74 such as o-ring is provided at the inner wall of the cylindrical portion 71 with a predetermined interval in longitudinal direction. Each elastic member 74 is formed as a continuous ring shape along inner circumference of the supporting member 7. The elastic member 74 may be formed as a discontinuous ring shape along inner circumference of the supporting member 7. The elastic member may be made of an organic polymeric material such as resin and rubber.

Attaching method of the ring yoke 61 to the thermal insulation vessel 3 will be explained as follows. First, the ring yoke 61 is placed on the projecting portion 72b of the supporting member 7, and fixed to the supporting member 7 using the second screw 87 as shown in FIG. 4. The supporting member 7 with the ring yoke 61 is fixed to the ring yoke attaching portion 85 of the ring yoke attaching jig 8 using a first screw 86. Next, the ring yoke attaching jig 8 is attached to the setting portion 43m of the cooling portion 43. In this condition, the supporting member 7 is placed above the thermal insulation vessel 3 with an interstice. Next, the movable shaft portion 83 is moved to arrow Y2 direction (downward direction in FIG. 4) in conjunction with rotating operation of the handle member 84 of the ring yoke attaching jig 8. The supporting member 7 supporting the ring yoke 61 is moved downward. Accordingly, the supporting member 7 is fitted to outer peripheral of the thermal insulation vessel 3. In this condition, the elastic member 74 provided at interior circumference of the supporting member 7 serves as a shock absorbing function, and the outer wall 34 of the thermal insulation vessel 3 serves as a guide. Therefore, the supporting member 7 supporting the ring yoke 61 is fit to outer peripheral of the thermal insulation vessel 3, and fixed. It follows that the ring yoke 61 attached to the ring yoke attaching portion 85 is placed around outer peripheral of the superconducting body 2.

After the projecting portion 72c of the supporting member 7 contacts to the projecting portion 36 of the thermal insulation vessel 3, the supporting member 7 is fixed to the cooling portion 43 by screwing a third screw 88 (a third attaching member). Next, the first screw 86 is unscrewed to make the supporting member 7 and the ring yoke attaching portion 85 of the ring yoke attaching jig 8 separable condition. In this condition, the ring yoke is placed along the outer circumference of the superconducting body 2 (shown in FIG. 5).

Continuously, the movable shaft portion 83 is moved to arrow Y1 direction (upward direction in FIG. 5, or along longitudinal direction of the movable shaft portion 83). Therefore, the ring yoke attaching jig 8 is separated from the ring yoke 61 wherein the ring yoke 61 is left at a position along the outer circumference of the superconducting body 2. Finally, the ring yoke attaching jig 8 is removed from the cooling portion 43.

Next, detaching method of the ring yoke 61 from the thermal insulation vessel 3 will be explained as follows. The ring yoke attaching jig 8 which is not holding the ring yoke 61 is moved so as to place the ring yoke attaching portion 85 along circumference of the superconducting body 2. Next, the projecting portion 72b of the supporting member 7 is attached to the ring yoke attaching portion 85 by screwing the first screw 86. Next, the third screw 88 is unscrewed. In this condition, the ring yoke 61 and the supporting member 7 are separable from the thermal insulation vessel 3, and attached to the ring yoke attaching jig 8. Next, the movable shaft portion 83 is moved to arrow Y1 direction by rotational operation of the handle member 84 so as to separate the ring yoke 61 and the supporting member 7 from the thermal insulation vessel 3.

According to the third embodiment, the cylindrical portion 71 of the supporting member 7 is formed essentially same shape as the outer wall 34 of the thermal insulation vessel 3 with a same axis. Therefore, the supporting member 7 may slide in attaching/detaching direction wherein the outer wall 34 of the thermal insulation vessel 3 serves as a guide. This configuration makes positioning operation of the ring yoke 61 to the superconducting body 2 easy.

According to the third embodiment, after the ring yoke 61 is removed from the thermal insulation vessel 3 accommodating the superconducting body 2, the superconducting body 2 is magnetized by means of same method as the first embodiment and the second embodiment. Namely, after the superconducting body 2 is magnetized, the ring yoke 61 is attached to the thermal insulation vessel 3 using the ring yoke attaching jig 8 so as to place the ring yoke 61 around the outer peripheral of the superconducting body 2.

Therefore, since the superconducting body 2 is magnetized with that the ring yoke 61 is removed condition, the superconducting magnet 100 (shown in FIG. 1) to use magnetizing may be made with smaller size than the condition that the ring yoke does not removed. In addition, the ring yoke 61 is easily attached to and detached from the thermal insulation vessel 3 since the ring yoke attaching jig 8 includes the supporting member 7 for supporting the ring yoke 61.

Since the ring yoke 61 is attached to the thermal insulation vessel 3 accommodating the ring yoke 61 (the ferromagnetic body 6) after magnetizing the superconducting body 2, the ring yoke 61 is not affected by a magnetic field generated at the magnetizing operation.

Figure 6:
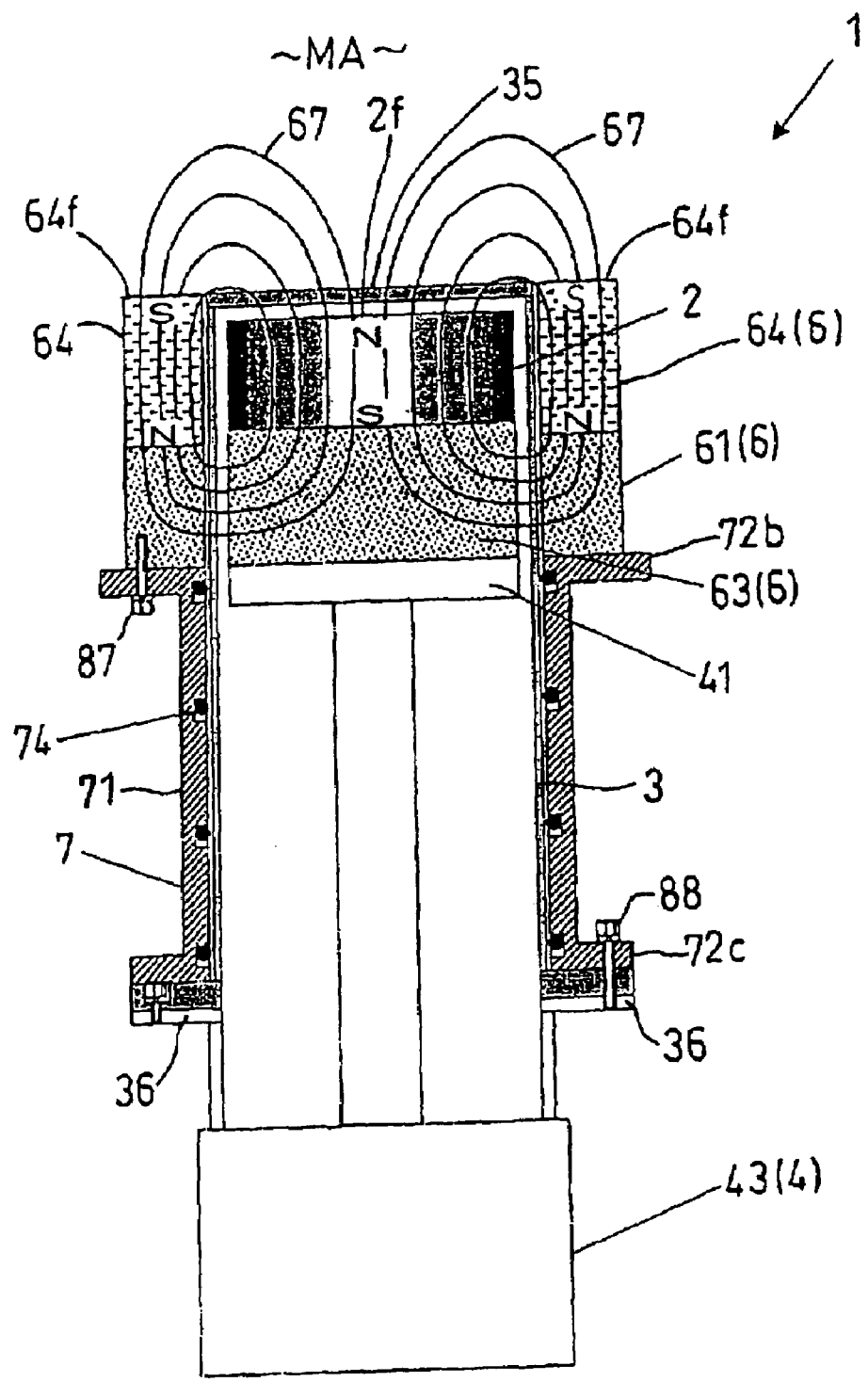
FIG. 6 is a cross sectional view illustrating a superconducting magnetic field generation apparatus according to a fourth embodiment of the present invention.

(Fourth embodiment) FIG. 6 shows a superconducting magnetic field generating apparatus 1 according to a fourth embodiment. In the fourth embodiment, same numbers as the first embodiment are applied for portions which operate similarly to the first embodiment thereof. Different points from the first embodiment will be explained as follows.

According to the fourth embodiment, the ferromagnetic body 6 is disposed around outer circumference of a superconducting body 2 and includes a permanent magnet 64 formed as ring shape, a ring yoke 61 disposed in the vicinity of the permanent magnet 64 with a same axis, a lower yoke 63 disposed under the superconducting body 2. The ring yoke 61 and the permanent magnet 64 are attached to a projecting portion 72b of a supporting member 7 so as to place along outer wall of a thermal insulation vessel 3.

Figure 7:
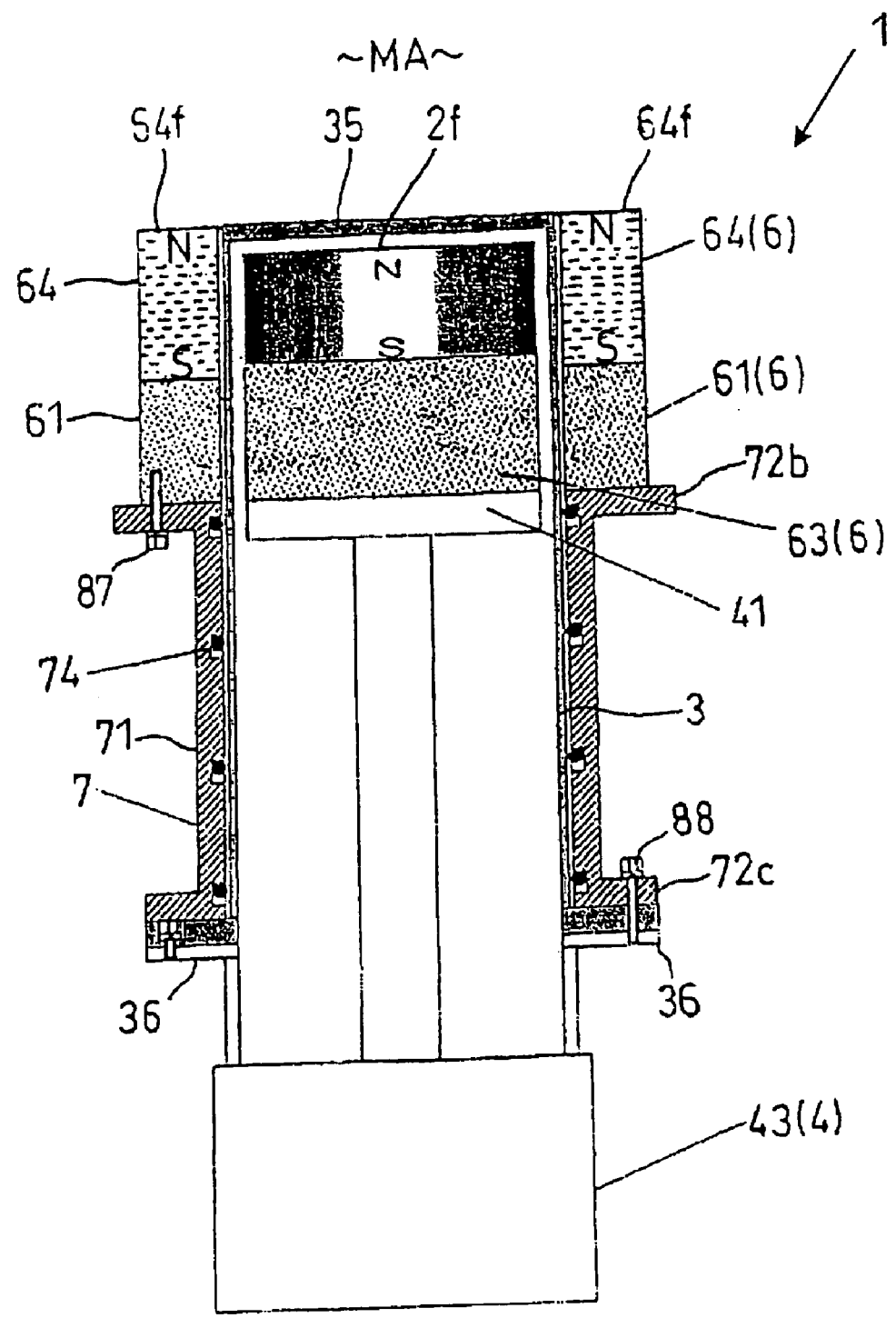
FIG. 7 is a cross sectional view illustrating a superconducting magnetic field generation apparatus according to a modified fourth embodiment of the present invention.

FIG. 7 shows a superconducting magnetic field generating apparatus 1 according to a modified fourth embodiment. In this case, a superconducting body 2 accommodated in a thermal insulation vessel 3 is magnetized with a condition that a permanent magnet 64 is not attached to the thermal insulation vessel 3. The ring-shaped permanent magnet 64 is fit to the upper end portion of the thermal insulation vessel 3 with the same axis after magnetizing the superconducting body 2. A magnetic polarity at an upper portion 64f of the permanent magnet 64 is similar to a magnetic polarity at an upper portion 2f of the superconducting body 2. According to this configuration, since the magnetic polarity of the permanent magnet 64 and the superconducting body 2 are same at upper side of each, a magnetic field generated from the superconducting body 2 may act to longer distance in upper direction in FIG. 7.

Figure 8:
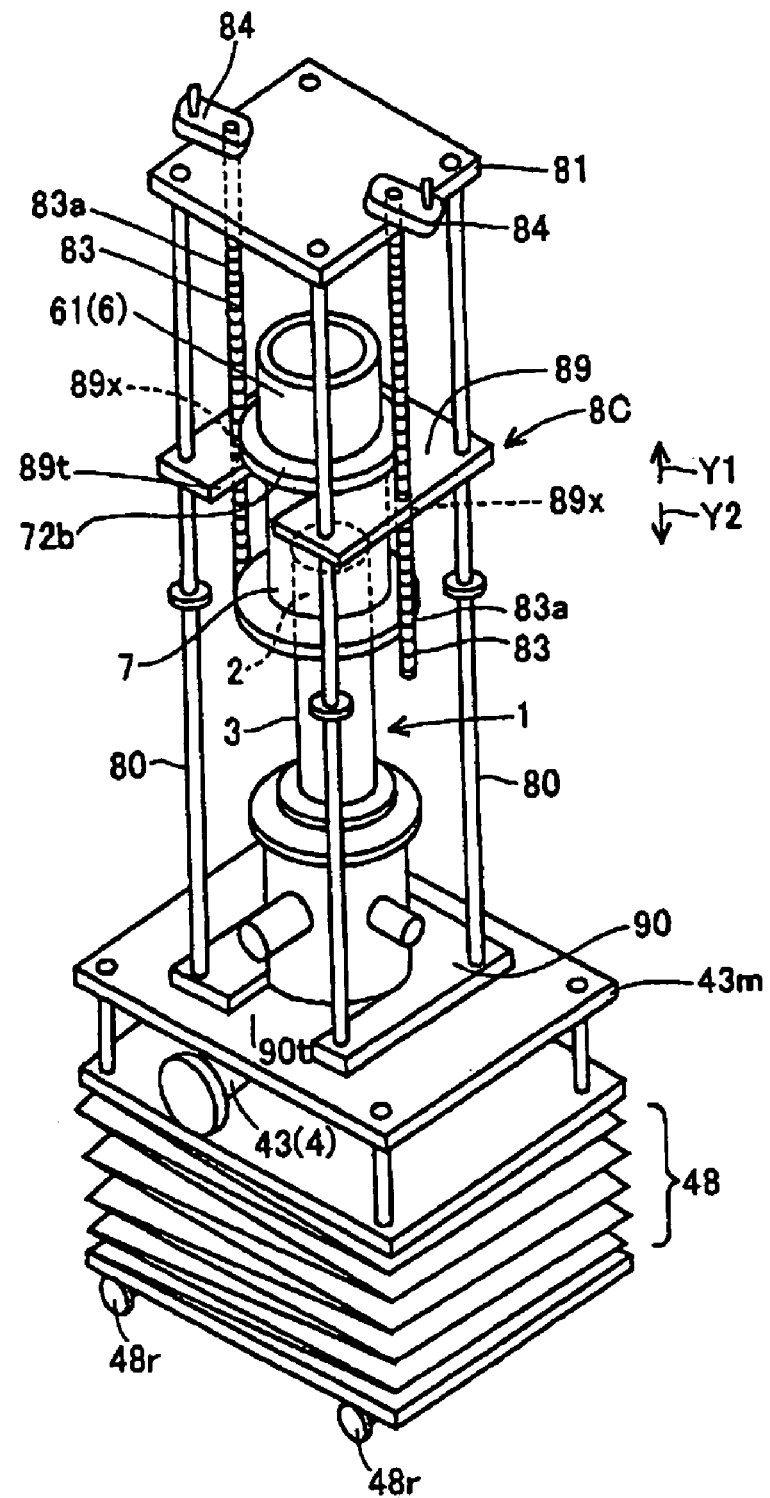
FIG. 8 is a perspective view illustrating attaching process of a ring yoke to a superconducting magnetic field generation apparatus using a ring yoke attaching/detaching means according to a fifth embodiment of the present invention.

(Fifth embodiment) FIG. 8 shows a superconducting magnetic field generating apparatus 1 according to a fifth embodiment. In the fifth embodiment, same numbers as the first embodiment are applied for portions which operate similarly to the first embodiment thereof. Different points from the first embodiment will be explained as follows.

In the fifth embodiment, a ring yoke attaching jig 8C can put on a setting portion 43m of a cooling portion 43 as shown in FIG. 8. The ring yoke attaching jig 8C includes plural pole 80 which serves as guiding member, connecting portions 81, 90 formed plate-like shape for connecting plural pole 80, a supporting member 89 which is movable in longitudinal direction of the pole 80, a movable shaft member 83 including a male screw 83a for screwing with a female screw portion 89X formed at the supporting member 89, and a handle member 84 which drives the movable shaft member 83 and moves the supporting member 89 in upward and downward by rotational operation. One side edge portion of the supporting member 89 is cut to form U-shape, and an engaging portion 89t for detachably engaging with a projecting portion 72b of a supporting member 7 is formed at the cut portion thereof. A cut portion 90t is formed at one side edge portion of the connecting portion 90 with U-shape so as to detachably engage with lower portion of the cooling portion 43. Both cut portions (i.e. the engaging portion 89t and the cut portion 90t) are formed at same side edge portion of each the supporting member 89 and the connecting portion 90.

An attaching method of a ring yoke 61 (a ferromagnetic body 6) to a thermal insulation vessel 3 using the ring yoke attaching jig 8C will be explained as follows using FIG. 8. The ring yoke 61 is disposed on the projecting portion 72b of the supporting member 7. The supporting member 7 is inserted to the engaging portion 89t of the supporting member 89 so as to support the supporting member 7 at underside of the projecting portion 72b. The supporting member 7 is fixed to the supporting member 89 using a screw (not shown). Then, the handle member 84 is rotated, the movable shaft member 83 transmits the rotating action, and the supporting member is moved to arrow Y2 direction (downward in FIG. 8) along the longitudinal direction of the movable shaft member 83. The ring yoke 61 and the supporting member 7 are moved to Y2 direction with the supporting member 89. Finally, the ring yoke 61 is placed around the circumference of a superconducting magnet 2 accommodated in the thermal insulation vessel 3.

On the other hand, the ring yoke 61 is removed from the thermal insulation vessel 3 in a reverse way. Namely, the ring yoke 61 and the supporting member 7 are set on the supporting member 89, the supporting member 89 is moved to arrow Y1 direction (upward direction in FIG. 8) by rotating the handle member 84 in opposite direction in response to move the supporting member to arrow Y2 direction.

As shown in FIG. 8, a cooling means 4 is disposed under the thermal insulation vessel 3. The cooling means includes the cooling portion 43. A lifting means 48 is provided under the cooling means 48. The lifting means 48 rises and falls the thermal insulation vessel 3 accommodating the superconducting body 2 and composed of a jack.

Figure 9:
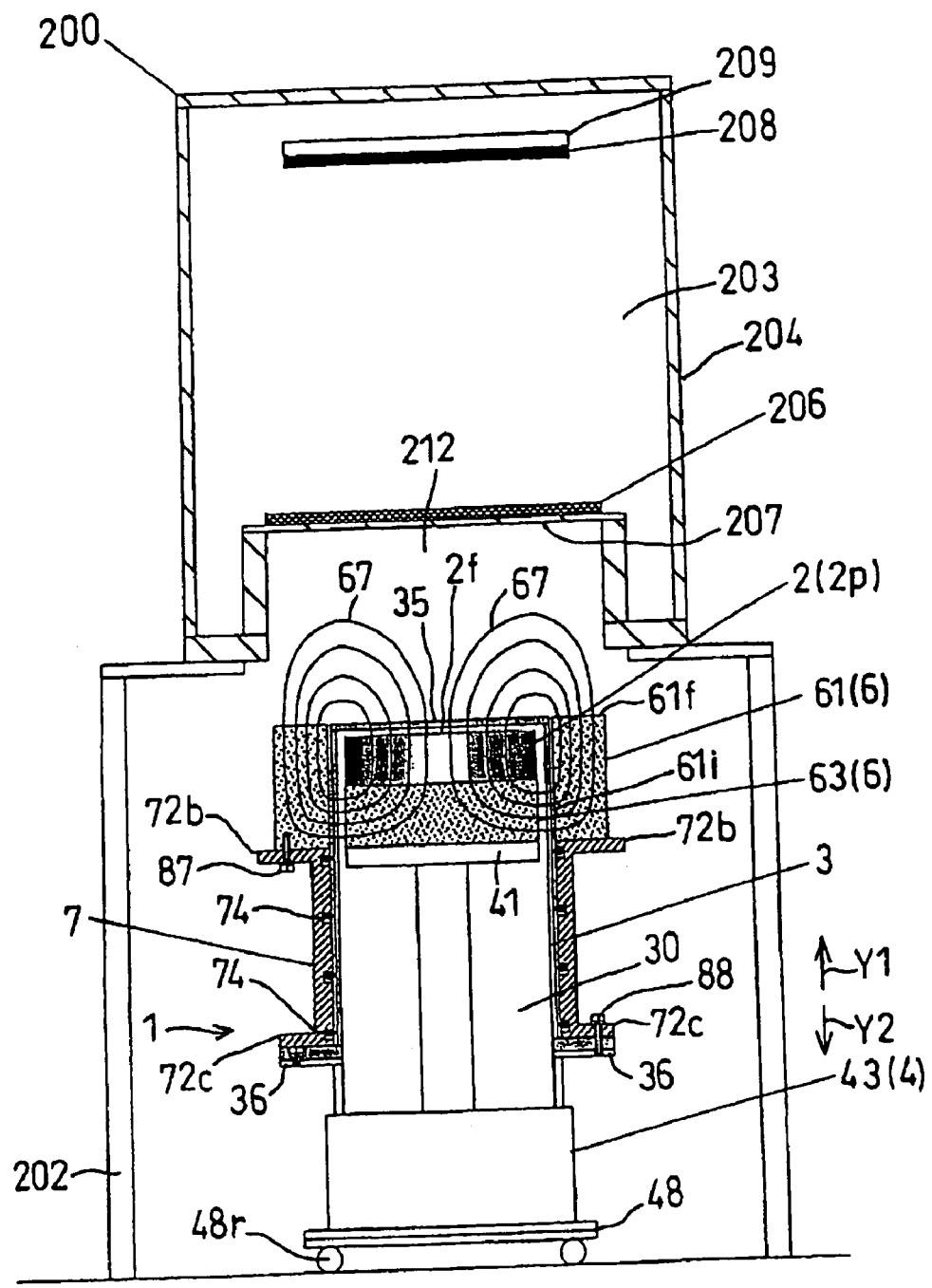
FIG. 9 is a cross sectional view illustrating a condition before attaching a superconducting magnetic field generation apparatus to a magnetron sputter coating apparatus according to a application example of the present invention.
Figure 10:
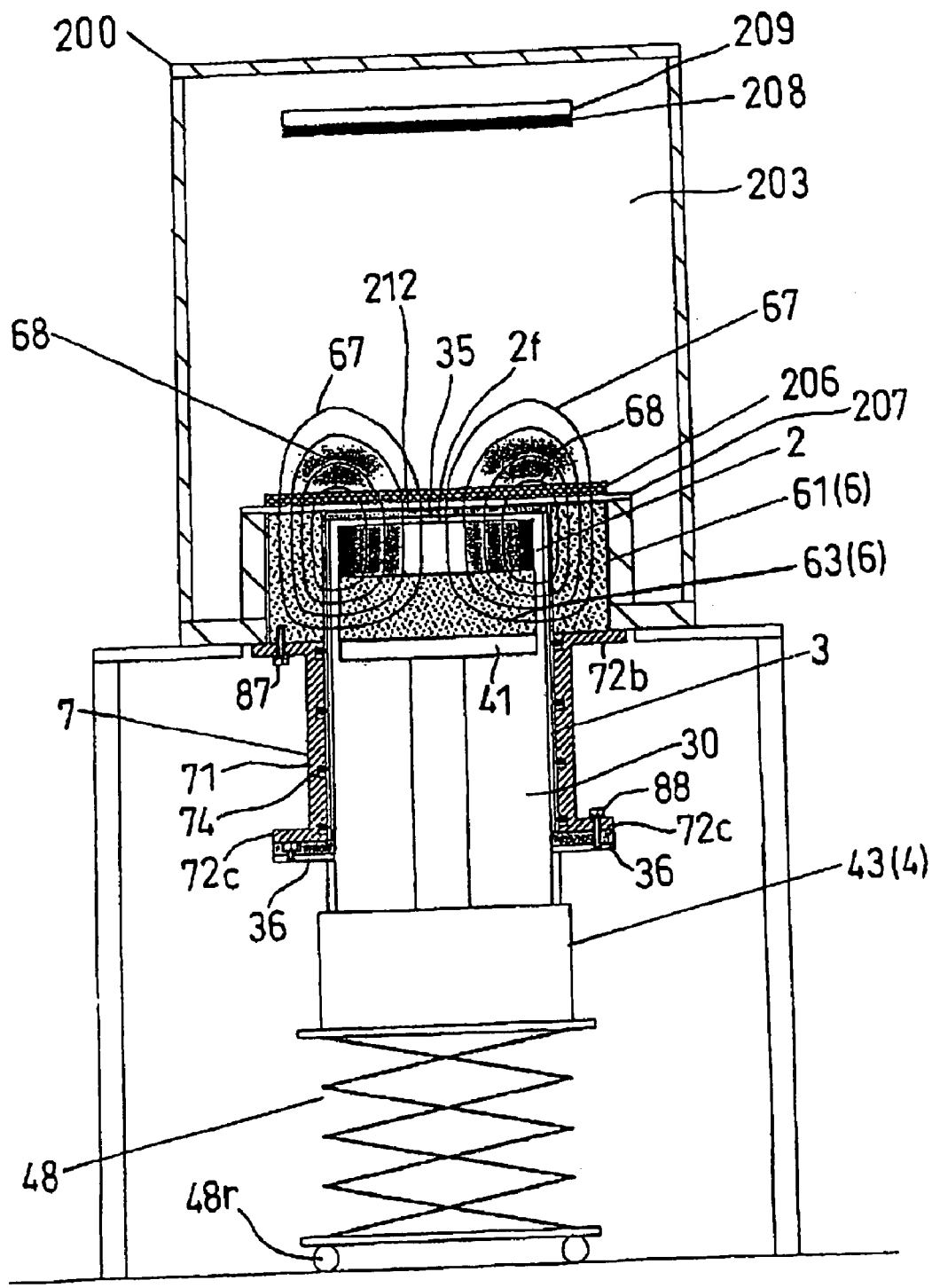
FIG. 10 is a cross sectional view illustrating a condition after attaching a superconducting magnetic field generation apparatus to a magnetron sputter coating apparatus according to a application example of the present invention.
Figure 11:
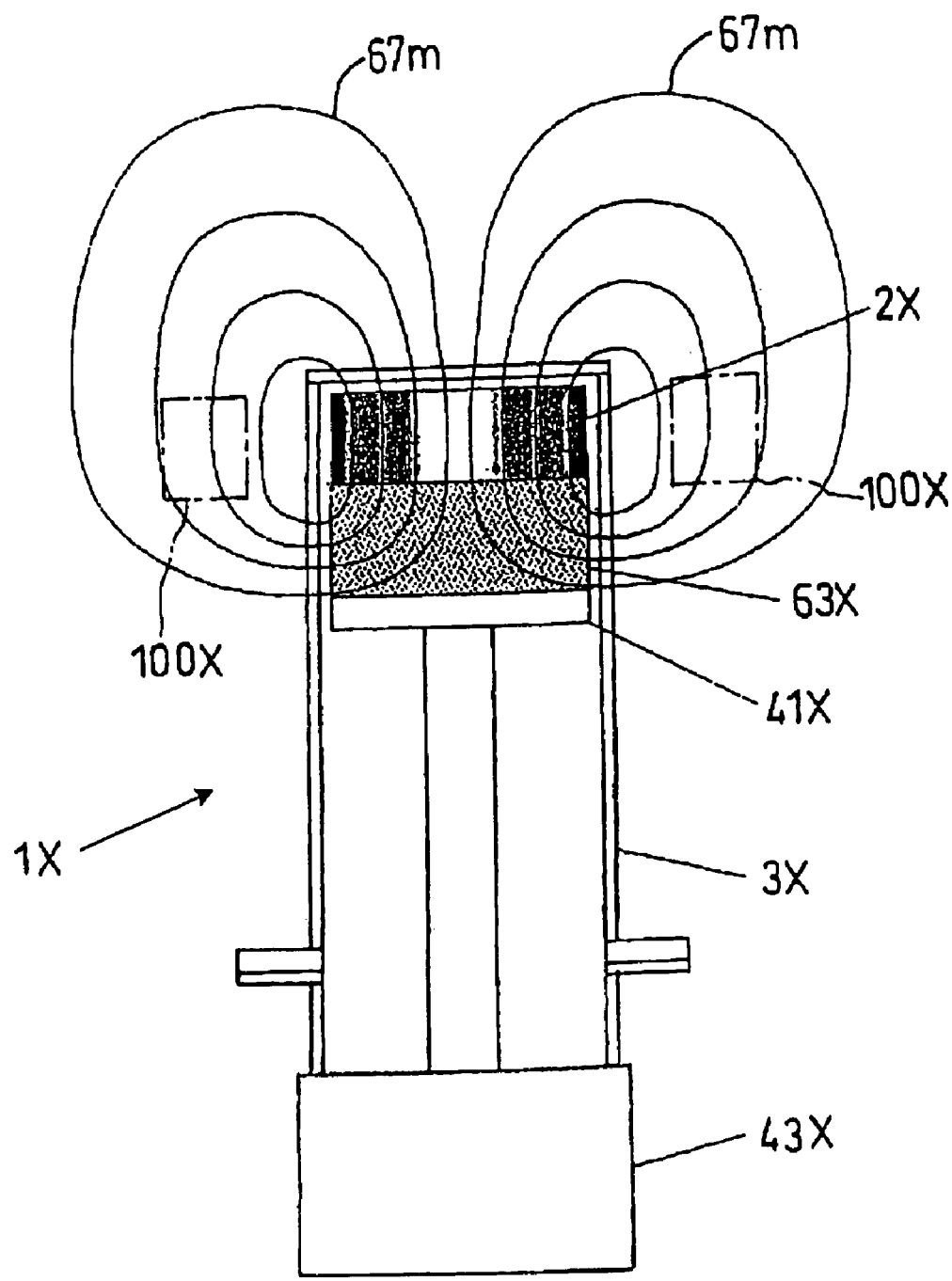
FIG. 11 is a cross sectional view illustrating a superconducting magnetic field generation apparatus according to a development example (not known at filing of the present application).
Figure 12:
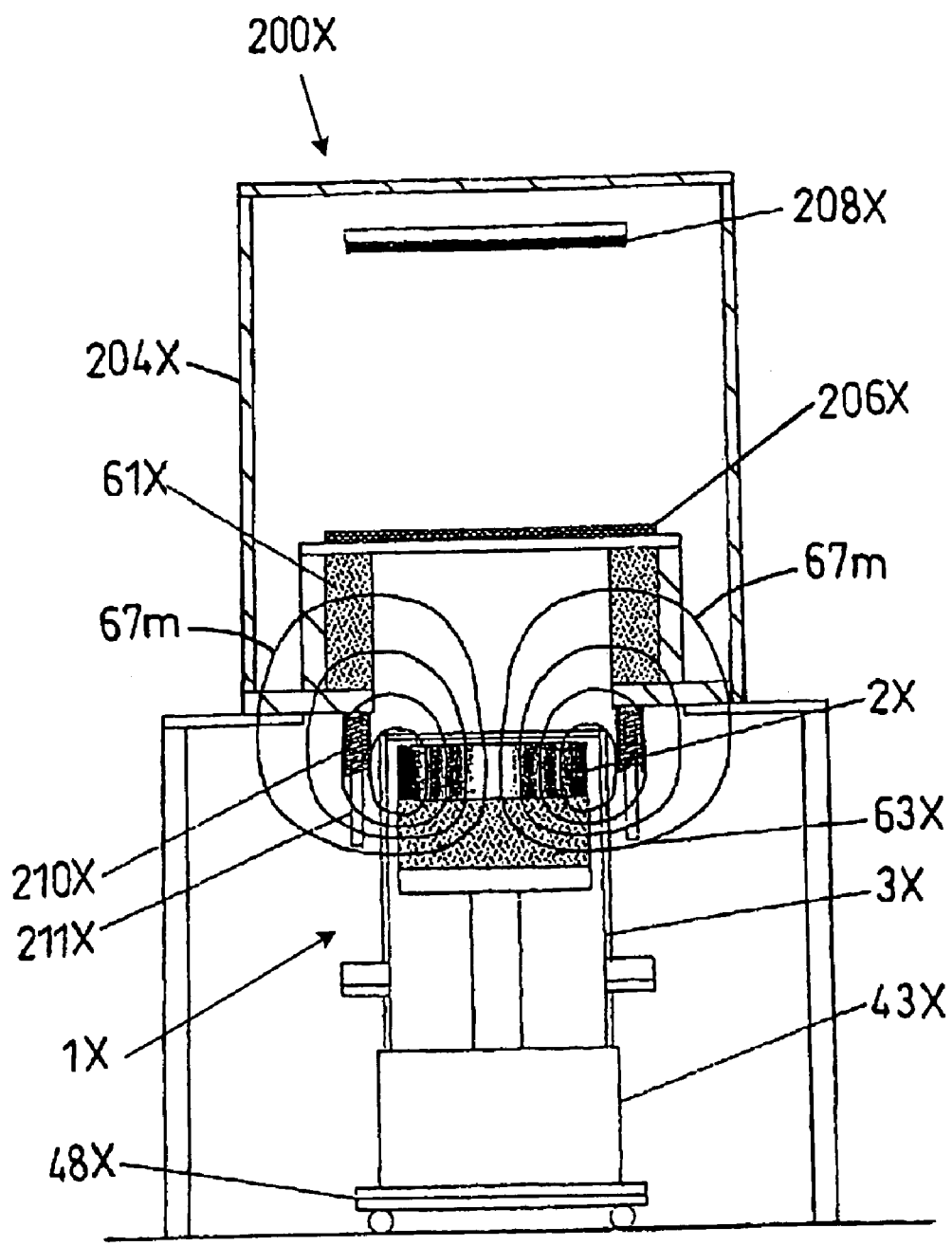
FIG. 12 is a cross sectional view illustrating a condition before attaching a superconducting magnetic field generation apparatus to a magnetron sputter coating apparatus according to a development example (not known at filing of the present application).
Figure 13:
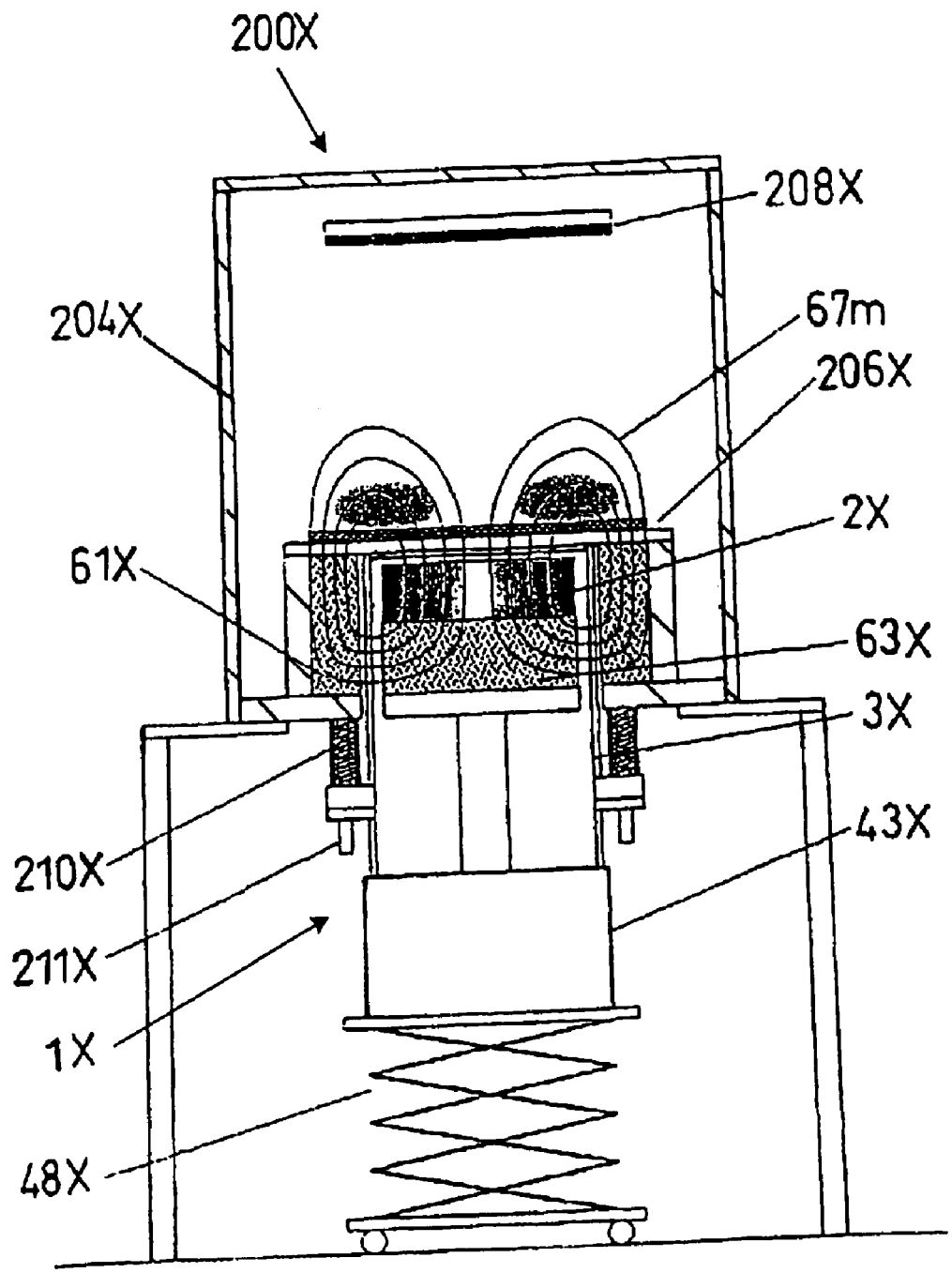
FIG. 13 is a cross sectional view illustrating a condition after attaching a superconducting magnetic field generation apparatus to a magnetron sputter coating apparatus according to a development example (not known at filing of the present application).

(Application example) FIG. 9 and FIG. 10 shows an application example of the superconducting magnetic field generating apparatus 1 according to the third embodiment shown in FIG. 3. The superconducting magnetic field generating apparatus 1 is attached to a magnetron sputter coating apparatus 200 (hereinbelow referred to as sputter coating apparatus 200) in this application example. FIG. 9 shows a condition before attaching the superconducting magnetic field generating apparatus 1 to the sputter coating apparatus 200. FIG. 10 shows a condition after attaching the superconducting magnetic field generating apparatus 1 to the sputter coating apparatus 200. The superconducting magnetic field generating apparatus 1 includes a superconducting body 2 for generating a magnetic field by applying a impressed magnetic field below a superconducting critical temperature, the thermal insulation vessel 3 including a space 30 accommodating the superconducting body 2, the cooling means 4 including the cooling portion 43 for cooling the superconducting body 2, and the ferromagnetic body for adjusting the magnetic field distribution 67 generated from the superconducting body 2.

The ferromagnetic body 6 includes the ring yoke 61 and the lower yoke 63, and disposed around the superconducting body 2. The cooling means 4 is disposed under the thermal insulation vessel 3, and the lifting means 48 is disposed under the cooling means 4. The lifting means 48 is composed of a jack for moving the thermal insulation vessel 3 accommodating the superconducting body 2 to allow Y1 and allow Y2 direction (upward and downward direction in FIG. 9).

As shown in FIG. 9, a member such as a coil for applying magnetic field is not disposed at the interstice 65 formed between the ring yoke 61 and the superconducting body 2, although a wall portion of the thermal insulation vessel 3 is exist. Therefore, the inner wall 61i of the ring yoke 61 may be arbitrarily closed to or separated from the outer wall 2p of the superconducting body 2 in the radial direction of each. In other words, there is a lot of flexibilities for arrangement of the ring yoke 61 relative to that the coil for applying magnetic field is provided between the ring yoke 61 and the superconducting body 2.

As shown in FIG. 9, the sputter coating apparatus 200 includes a base 202, a vacuum chamber 204 disposed on the base 202 including a coating chamber 203 maintained at low pressure condition (e.g. $10^{-4}$–$10^{-5}$ Torr) using a vacuum pumping system (not shown), and the superconducting magnetic field generating apparatus 1 which serves as a sputter gun for concentrating plasma into the vicinity of a surface of a target 206 by the effect of the magnetic field 67. The target is made of a raw material for making a thin film. The vacuum chamber 204 includes a target holder 207 disposed at lower portion of the coating chamber 203 for supporting the target 206 and an object holder 209 disposed at upper portion of the coating chamber 203 for supporting a coated material 208. An insertion space 212 is formed under the target 206.

Attaching method of the superconducting magnetic field generating apparatus 1 to the sputter coating apparatus 200 will be explained as follows. As shown in FIG. 9, the superconducting magnetic field generating apparatus 1 is placed under the insertion space 212 of the vacuum chamber 204. Then, the lifting means 48 of the superconducting magnetic field generating apparatus 1 is operated to move the arrow Y1 direction (upward direction). The upper portion of the superconducting magnetic field generating apparatus 1 is inserted to the insertion space 212 so as to approach an upper end wall 35 of the thermal insulation vessel 3 to the target holder 207 as shown in FIG. 10. In this manner, a magnetic circuit 67 generated from the superconducting body 2 (super conducting bulk magnet) is formed in the vicinity of the target 206 in the coating chamber 203.

Next, an example of coating method will be explained as follows. First, the coating chamber 203 is evacuated to high vacuum condition (e.g. on the order of $10^{-6}$ Torr) using a vacuum pumping system (not shown). In this operation, the evacuation is took place so as to that impurity gases does not remained in the coating chamber 203. Next, a sputter gas is put in the coating chamber 203 from an insert port, and the pressure is adjusted to a predetermined pressure. Then, a predetermined voltage is applied between the target 206 and the coated material 208. The voltage is generally applied so that the target 206 roles as negative electrode and the coated material 208 roles as positive electrode. Then, plasma discharge is generated in the coating chamber 203. In plasma 68, electrons are moved according to acting magnetic field, and the electrons make a sputter gas (generally argon gas is used, but not be limited as the sputter gas) ionized state. The plasma state sputter gas ion is moved to surface of the target 206 and accelerated since the voltage is applied to the target 206. The accelerated sputter gas collides with the surface of the target 206. Then, a target substance is sputtered from the surface of the target 206, deposited on the surface of the coated material 208, and a thin film is formed on the surface of the coated material 208. In this method, the superconducting magnetic field generating apparatus serves as a sputter gun.

According to this coating method, strong magnetic field generated from the superconducting body 2 makes concentration of the plasma 68 higher in the vicinity of the surface of the target 206. Therefore, discharging may be carried out with high vacuum condition in the coating chamber 203, deposition speed may be increased, and impurities in the thin film may be diminished. Although the applied voltage is set so that the target 206 roles as negative electrode and the coated material 208 roles as positive electrode in the application example, it is not limited to this condition. Namely, alternate current may be applied between the target 206 and the coated material 208.

This invention is not limited to above mentioned embodiments and figures. For example, the superconducting magnetic field generating apparatus may be applied to various strong magnetic field application equipments such as a magnetic separator, a magnetic field pressing equipment, a nuclear magnetic resonance equipment, an electric generator, and a motor.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the sprit of the present invention. Accordingly, it is expressly intended that all such variations, changes and equivalents which fall within the spirit and scope of the present invention as defined in the claims, be embraced thereby.

The invention claimed is:

1. A superconducting magnetic field generating apparatus comprising:
   a superconducting body which generates a magnetic field distribution below a critical temperature of the superconducting body;
   a thermal insulation vessel having a space which accommodates the superconducting body; and
   a ferromagnetic body which adjusts the magnetic field distribution generated from the superconducting body;
   wherein at least a part of the ferromagnetic body is disposed around the superconducting body, and the ferromagnetic body adjusts the magnetic field distribution in a space outside of the superconducting body and the ferromagnetic body.

2. A superconducting magnetic field generating apparatus according to claim 1, wherein the ferromagnetic body is detachably attached to an outer side of the thermal insulation vessel.

3. A superconducting magnetic field generating apparatus according to claim 2, further comprising a supporting member which supports the ferromagnetic body, is detachably provided to the thermal insulation vessel and detachably sets the ferromagnetic body to a circumferential predetermined position of the thermal insulation vessel.

4. A superconducting magnetic field generating apparatus according to claim 3, wherein the supporting member is moved in axial direction of the thermal insulation vessel along an outer wall of the thermal insulation vessel as a guide.

5. A superconducting magnetic field generating apparatus according to claim 1, wherein the ferromagnetic body is provided with the thermal insulation vessel as a unit.

6. A superconducting magnetic field generating apparatus according to claim 1, wherein the ferromagnetic body is accommodated in the thermal insulation vessel.

7. A superconducting magnetic field generating apparatus according to claim 1, wherein the ferromagnetic body is cooled using a cooling means.

8. A superconducting magnetic field generating apparatus according to claim 1, wherein the superconducting body is prepared by melt processing method.

9. A superconducting magnetic field generating apparatus according to claim 8, wherein a major element of the superconducting body is RE-Ba—Cu—O (RE is at least one of Y, La, Nd, Sm, Eu, Gd, Er, Yb, Dy and Ho).

10. A superconducting magnetic field generating apparatus according to claim 9, wherein the superconducting body includes at least one of Ag, Au, Pt, Rh and Ce.

11. A superconducting magnetic field generating apparatus according to claim 1, wherein the superconducting magnetic field generating apparatus is detachably attached to any apparatus which uses strong magnetic field.

12. A sputter coating apparatus for coating a material by applying a raw material supplied from a target to a surface of the material to be coated, comprising:
   a target holder which supports the target including the raw material;
   an object holder which supports the material to be coated;
   a vacuum chamber including the target holder and the object holder; and
   a sputter gun which is provided adjacent to the target holder and generates a magnetic field; wherein the sputter gun is composed of the superconducting magnetic field generating apparatus according to one of claims 1–11 and generates the magnetic field so as to concentrate on surface of the target.

13. A superconducting magnetic field generating apparatus comprising:
- a superconducting body which generates a magnetic field below a critical temperature of the superconducting body;
- a cooling apparatus which cools the superconducting body below the critical temperature;
- a thermal insulation vessel having a space which accommodates the superconducting body; and
- a ferromagnetic body disposed at outer circumference of the superconducting body, wherein a magnetic circuit is formed to pass through the ferromagnetic body and the superconducting body.

14. A superconducting magnetic field apparatus according to claim 13, wherein the ferromagnetic body is detachably attached to an outer side of the thermal insulation vessel.

15. A superconducting magnetic field generating apparatus according to claim 14, further comprising a supporting member which supports the ferromagnetic body, is detachably provided to the thermal insulation vessel and detachably sets the ferromagnetic body to a circumferential predetermined position of the thermal insulation vessel.

16. A superconducting magnetic field generating apparatus according to claim 15, wherein the supporting member is moved in axial direction of the thermal insulation vessel along an outer wall of the thermal insulation vessel as a guide.

17. A superconducting magnetic field generating apparatus according to claim 13, wherein the ferromagnetic body is provided with the thermal insulation vessel as a unit.

18. A superconducting magnetic field generating apparatus according to claim 13, wherein the ferromagnetic body is accommodated in the thermal insulation vessel.

19. A superconducting magnetic field generating apparatus according to claim 13, wherein the ferromagnetic body is cooled using a cooling means.

20. A superconducting magnetic field generating apparatus according to claim 13, wherein the superconducting magnetic field generating apparatus is detachably attached to any apparatus which uses strong magnetic field.

21. A superconducting magnetic field generating apparatus according to claim 1, wherein the ferromagnetic body comprises a yoke.

* * * * *